(12) United States Patent
Steen et al.

(10) Patent No.: US 7,777,405 B2
(45) Date of Patent: Aug. 17, 2010

(54) WHITE LED HEADLIGHT

(75) Inventors: Ronald L. Steen, Clarkston, MI (US); Kyle P. Lucas, Clawson, MI (US)

(73) Assignee: Odelo GmbH, Esslingen (DE)

( * ) Notice: Subject to any disclaimer, the term of this patent is extended or adjusted under 35 U.S.C. 154(b) by 1280 days.

(21) Appl. No.: 10/521,286

(22) PCT Filed: Jul. 16, 2003
(Under 37 CFR 1.47)

(86) PCT No.: PCT/US03/22247
§ 371 (c)(1),
(2), (4) Date: Dec. 14, 2005

(87) PCT Pub. No.: WO2004/007241

PCT Pub. Date: Jan. 22, 2004

(65) Prior Publication Data

US 2007/0018181 A1     Jan. 25, 2007

Related U.S. Application Data

(60) Provisional application No. 60/396,348, filed on Jul. 16, 2002.

(51) Int. Cl.
*F21V 21/00* (2006.01)
*H01L 33/00* (2010.01)
*F21S 8/10* (2006.01)

(52) U.S. Cl. .................. 313/501; 313/498; 362/545; 362/546

(58) Field of Classification Search .......... 313/498, 313/501–502, 110, 503; 362/545–547
See application file for complete search history.

(56) References Cited

U.S. PATENT DOCUMENTS

| | | | |
|---|---|---|---|
| 4,774,434 A | | 9/1988 | Bennion |
| 4,951,179 A | | 8/1990 | Machida |
| 5,709,453 A | * | 1/1998 | Krent et al. ............... 362/496 |
| 5,813,753 A | | 9/1998 | Vriens et al. |
| 5,833,347 A | * | 11/1998 | Nakamura et al. ......... 362/507 |
| 5,854,867 A | | 12/1998 | Lee et al. |
| 5,857,767 A | | 1/1999 | Hochstein |
| 5,998,925 A | | 12/1999 | Shimizu et al. |
| 6,345,903 B1 | | 2/2002 | Koike et al. |
| 2001/0030866 A1 | * | 10/2001 | Hochstein .................. 362/294 |
| 2006/0215416 A1 | * | 9/2006 | Lucas et al. ............... 362/545 |

* cited by examiner

OTHER PUBLICATIONS

PCT International Search Report, PCT/US03/22247—Filed: Jul. 16, 2003.

*Primary Examiner*—Karabi Guharay
(74) *Attorney, Agent, or Firm*—Laurence A. Greenberg; Werner H. Stemer; Ralph E. Locher

(57) ABSTRACT

A vehicle headlight (12) that employs a plurality of LED units (38) that emit white light. Each LED unit (38) employs chip-on-board technology where LED semiconductor chips (64) are mounted directly to a submount substrate (56) using solder or stud bumps (60). An elongated lens (28) is molded over the LED unit (38) in contact with a base substrate (48). Light emitted from the semiconductor chip (64) is reflected and directed by the lens (28) to generate a beam of light (58). Some of the light emitted from the LED semiconductor chip (64) is redirected back to the submount substrate (56) to be reflected back into the lens (28) to increase the light intensity of the LED unit (38). Several of the elongated lens (28) and associated LED units (38) are optically glued to a single prism (24) that collects all of the light beams from all of the LED units (38).

19 Claims, 6 Drawing Sheets

US 7,777,405 B2

WHITE LED HEADLIGHT

This application is a National Stage of International Application No. PCT/US03/22247, filed Jul. 16, 2003; which claims the benefit of U.S. Provisional Application No. 60/396,348, filed Jul. 16, 2002. The disclosures of the above applications are incorporated herein by reference.

BACKGROUND OF THE INVENTION

1. Field of the Invention

This invention relates generally to an LED light for a vehicle and, more particularly, to a white LED headlight for a vehicle that employs chip-on-board circuit technology for electrically mounting the LEDs to a circuit board.

2. Discussion of the Related Art

Vehicle styling and appearance provides significant and important advantages for attracting customers. One recognized area that is known to enhance vehicle attraction is the appearance and design of the various vehicle lights, sometimes referred to as the vehicle's jewels, including, but not limited to, headlights, tail lights, turn signals, back-up lights, center high mounted stop lamps (CHMSLs), running lights, fog lamps, side markers, etc. In fact, modern vehicle designs pay close attention to the styling and design of the vehicle lights.

Current vehicle lights employ various types of light sources suitable for different designs and conditions. For example, vehicle lighting designs have employed incandescent lamps, neon tubes, halogen lamps, xenon lamps, etc. Some modern vehicle light designs have employed light emitting diodes (LEDs) that are able to provide various colors in an inexpensive and compact arrangement. LEDs typically do not suffer from burn-out, and have good drive characteristics, high luminance, high efficiency, high vibration resistance and durability to endure repetitive on/off operations. Therefore, LEDs have been attractive for vehicle lighting.

LEDs emit monochromatic light at wavelengths depending on the doping characteristics of the LED semiconductor material. Traditionally, the most efficient LEDs have emitted red light, green light or blue light. It has heretofore not been possible to provide an LED semiconductor material that emits white light. However, various LED designs are available that convert colored light to white light. One design employs a combination of red, green and blue LEDs arranged close together. The light from the LEDs is combined and diffused to provide the white light. However, these types of LED designs have typically been limited because of variances in tone, luminance and drive power of the different LEDs.

Another white light LED design employs a colored light LED and a fluorescent material that absorbs the colored light and emits white light. U.S. Pat. No. 6,069,440, issued May 30, 2000 to Shimizu et al., discloses a white light LED including a layer of phosphor deposited over a blue light LED. The phosphor includes a fluorescent that absorbs the blue wavelength light and emits white light. In one particular design, the LED material is InGaN and the phosphor layer includes an yttrium-aluminum-garnet fluorescent material.

There is a push in the automotive industry to develop white light LEDs so that LEDs can be used in vehicle headlights. Important design concerns for vehicle headlights come into play when using the existing technology for generating white light from LED semiconductors, such as employing blue light emitting LEDs in combination with a phosphor layer. Particularly, intensity and directional considerations are important for the tightly regulated headlight requirements. Further, providing a compact, efficient, low cost and aesthetically pleasing LED package is necessary.

SUMMARY OF THE INVENTION

In accordance with the teachings of the present invention, a vehicle headlight is disclosed that employs a plurality of LED units that emit white light. The LED units employ chip-on-board technology where an LED semiconductor chip is mounted directly to a submount substrate by solder or stud bumps. In an alternate embodiment, the submount substrate is eliminated, and the LED semiconductor chip is mounted directly to a primary substrate. A primary optic lens is injection molded over the LED unit in contact with a base substrate. In one embodiment, a silicon gel layer is formed over the LED unit before injection molding to better adhere the primary optic lens to the LED unit without an air gap therebetween. Light emitted from the semiconductor chip is transmitted into the lens and directed by the lens to generate a beam of light. In one embodiment, several of the lenses and associated LED units are optically glued to a single optical structure that collects all of the light beams from all of the LED units. The optical structure can be one of several headlight units for generating the final beam of light.

Additional advantages and features of the present invention will become apparent from the following description and appended claims, taken in conjunction with the accompanying drawings.

DETAILED DESCRIPTION OF THE EMBODIMENTS

The following discussion of the embodiments of the invention directed to a white LED headlight for a vehicle is merely exemplary in nature, and is in no way intended to limit the invention, or its application or uses.

Figure 1:
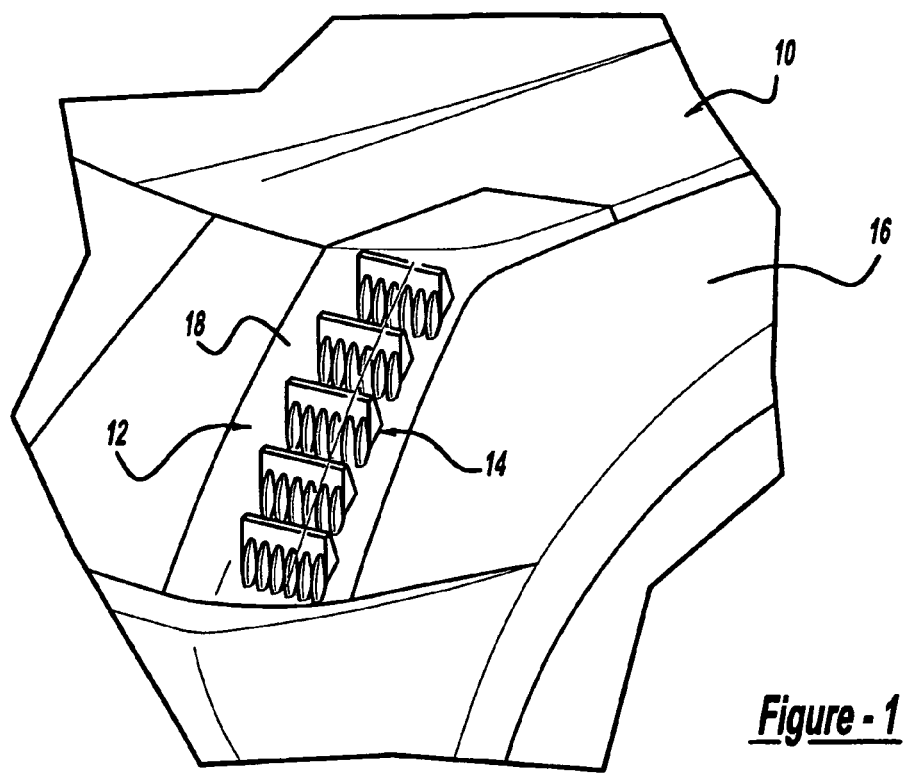
FIG. 1 is a broken-away perspective view of a vehicle including a headlight employing a plurality of headlight units each including a plurality of LED units emitting white light, according to an embodiment of the present invention.

FIG. 1 is a broken-away perspective view of a vehicle 10 including a headlight 12. In this design, the headlight 12 includes five separate headlight units 14 each generating a separate beam of light. Each light beam generated by each headlight unit 14 forms the complete light beam from the headlight 12, where the light beams from the several headlight units 14 overlay each other to provide the desired light intensity. The headlight 12 is mounted to a vehicle structure 16 at a desirable location, and is positioned behind a non-active outer lens 18. In an alternate design, the outer lens 18 can be eliminated by sealing the various environmentally sensitive components of the headlight 12 in other ways. As will be discussed in detail below, each headlight unit 14 includes an LED design that emits white light that provides the intensity and directional requirements of the vehicle headlight regulations. The specific design, orientation, and number of headlight units 14 are not specific to the invention in that other configurations can be employed within the scope of the present invention.

Figure 2:
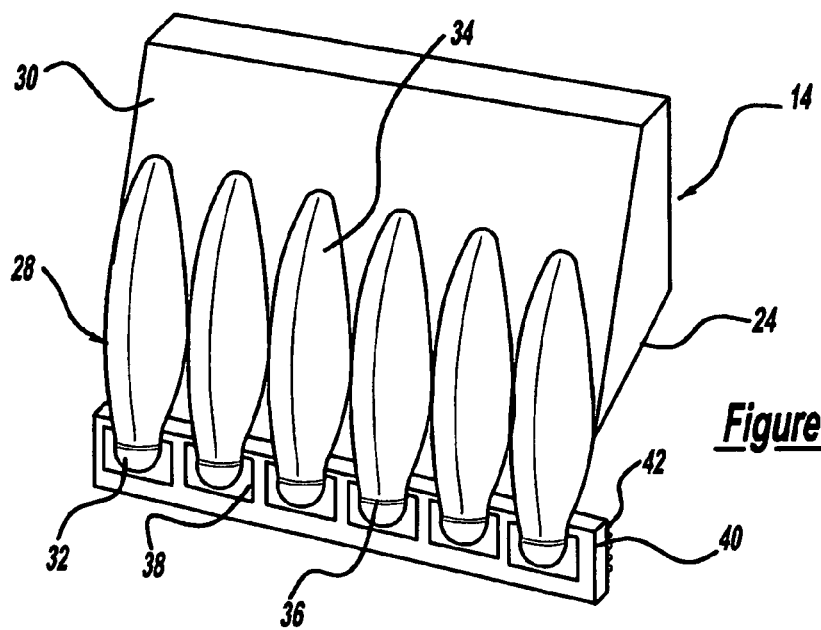
FIG. 2 is a perspective view of one of the headlight units separated from the vehicle headlight shown in FIG. 1.

FIG. 2 is a perspective view of one of the headlight units 14 removed from the headlight 12. The headlight unit 14 includes a reflective prism 24 made of a suitable optical material, such as a clear glass or plastic. A plurality of elongated primary lenses 28 are optically glued to a front face 30 of the prism 24. Each lens 28 is a single piece injection molded optical lens including a head portion 32 and an elongated body portion 34 defining a ridge 36 therebetween. The head portion 32 is molded over an LED unit 38, discussed in detail below, to form a single piece structure. For example, the LED unit 38 is mounted in a die or tool in an injection molding machine. The mold has the same shape as the lens 28 so that when the optical plastic is injected into the mold, the resulting unit is a single piece combination of the light unit 38 and the lens 28.

In an alternate embodiment, the LED unit 38 can include it's own clear protective dome that is glued to a cooperating cavity in the lens 28 by an optically neutral epoxy. Also, in another embodiment, the injection molded primary optic lens can be a dome lens formed over the LED unit 38. Additional optics can be then provided in connection with the primary optic lens, where air gaps may be provided between the various optics. The shape of the primary optic lens can be any shape suitable for a particular application.

By molding the lens 28 over the LED unit 38 as described herein, secondary optics that are typically employed in LED light assemblies can be eliminated. Thus, the primary optics, i.e., the lens 28, is the only optic that provides beam directing and focusing. As discussed herein, the light is completely encapsulated in a solid dielectric, specifically the lens 28 and the prism 24, so that the light does not propagate through air prior to being emitted from the headlight unit 14. This provides desirable advantages because typically up to 5% of the light is lost if it propagates through air. By providing the light completely encapsulated in a dielectric, the known reflector and lens is combined, and total internal reflection, refraction and regular reflection is employed. In an alternate embodiment, the prism 24 can be eliminated, and the lens 28 can be directed in the desirable manner to provide the beam of light.

In those embodiments where the LED units 38 are not employed for headlight applications, the lens 28 can be tinted to provide the desired color of light. In alternate designs, optics can be employed to create a far field beam pattern with a single lens. Further, each LED unit 38 and associated lens 28 can each provide the complete or total beam pattern for the headlight 12. This has the advantage that if one or more of the LED units 38 burns out, part of the beam pattern will not be completely eliminated. Alternately, some of the LED units 38 can be provided for one part of the beam pattern, and others of the LED units 38 can be provided for other parts of the beam pattern.

The LED units 38 are mounted to a common mounting plate 40. In this embodiment, there are six LED units 38 for each headlight unit 14 providing a total of thirty LED units 38. The light units 38 are spaced a certain distance apart on the mounting plate 40 to provide the desired intensity, the desired a esthetics and the ability to provide suitable cooling. A finned heat sink 42 is mounted to the mounting plate 40 for removing heat from the units 38. The heat sink 42 is intended to be a general representation of any heat sink or cooling mechanism, such as a thermoelectric cooler or heatpipe, suitable for the purposes described herein. The units 38 are coupled to the plate 40 by any suitable thermally conductive material.

Figures 3, 4:
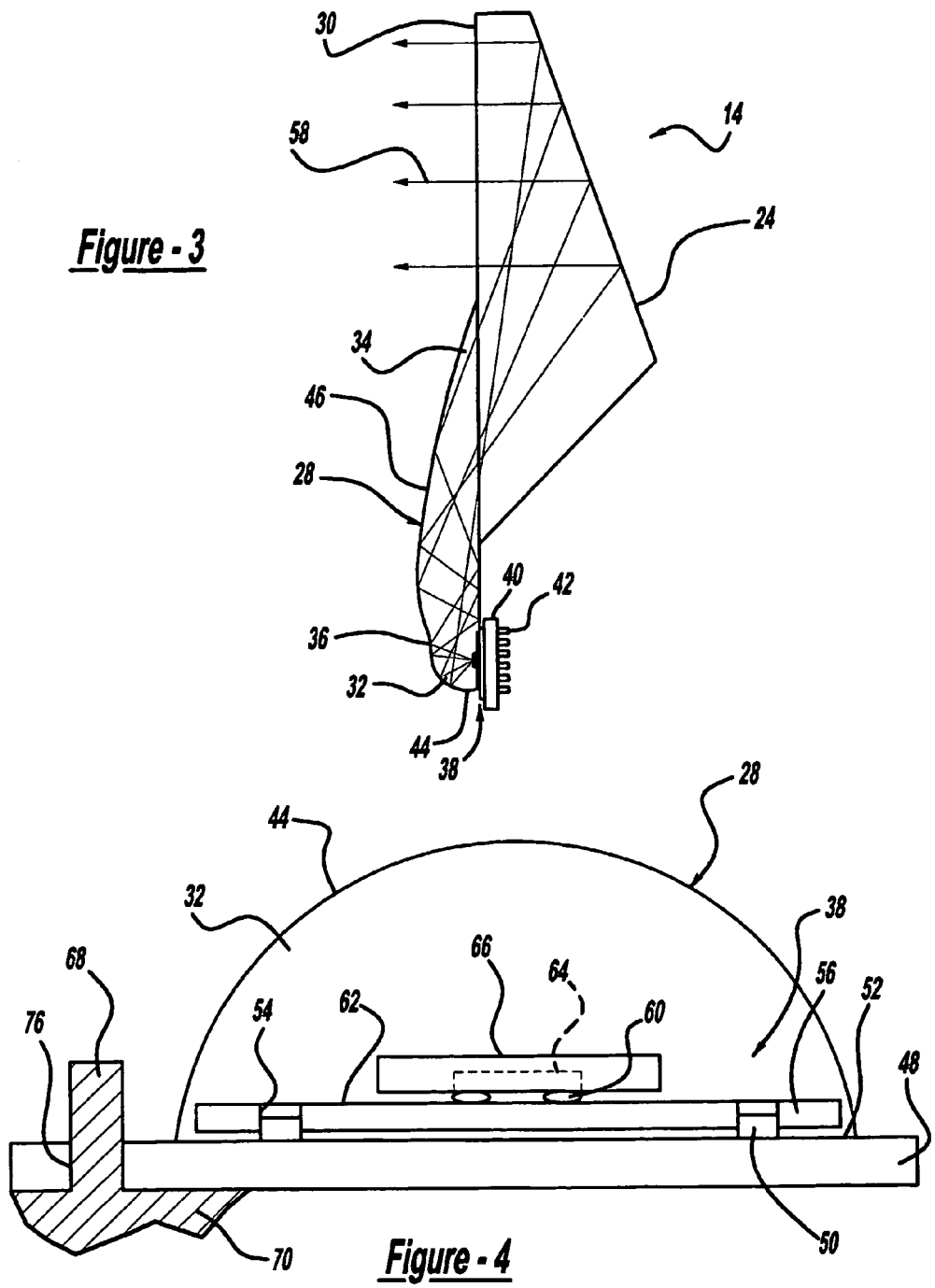
FIG. 3 is a side view of the headlight unit shown in FIG. 2 showing the light rays.
FIG. 4 is front view of one of the LED units removed from the headlight unit shown in FIG. 2.

FIG. 3 is a side view of the unit 14 depicting light rays 58 of the light generated by the LED units 38. As is apparent, light emitted from the LED unit 38 is directed to an outer surface 44 of the head portion 32 and is reflected therefrom into the body portion 34. In one embodiment, the outer surface 44 is coated with a reflective film, such as a silver film. The silver film can be placed in the die when the lens 28 is molded so that it adheres to the surface 44. Part of the light is reflected from the surface 44 to be directed back towards the LED unit 38, as will be discussed in more detail below. Some of the light that is directed onto the body portion 34 is reflected off of an outer surface 46 of the body portion 34 and directed through the transition between the body portion 34 and the prism 24. The light is reflected and directed through the prism 24 to be emitted through the front face 30 of the prism 24 as a beam of white light.

Figure 5:
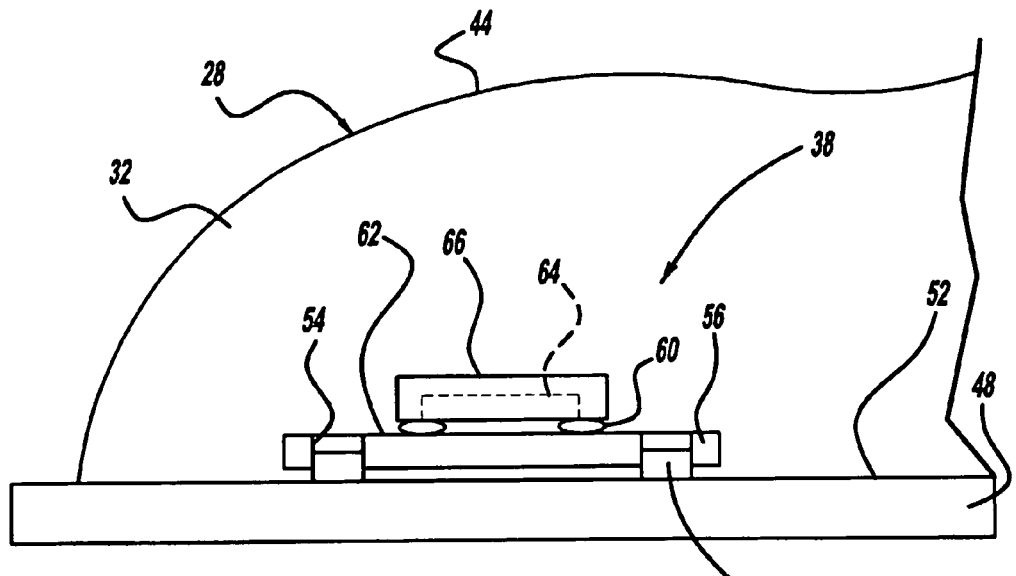
FIG. 5 is a cut-away side view of the LED unit shown in FIG. 4.

FIG. 4 is a front view and FIG. 5 is a side view of one of the LED units 38. The unit 38 includes a metal core board (MCB) 48 that acts as a main substrate for the unit 38, and provides an electrical connection thereto. A series of solder or stud bumps 50 are deposited on a top surface 52 of the MCB 48, and are electrically coupled to suitable electrical traces thereon. The solder or stud bumps 50 are electrically coupled to electrical vias 54 extending through a submount 56 that is mounted to the top surface 52 of the MCB 48. The vias 54 are electrically coupled to solder or stud bumps 60 on a top surface 62 of the submount 56. The solder or stud bumps 60 are electrically coupled to an LED semiconductor chip 64 made of a semiconductor material that emits light in response to the electrical potential applied thereto. In this embodiment, the semiconductor chip 64 emits blue light. A phosphor layer 66 is deposited over the chip 64. The phosphor layer 66 absorbs the blue light emitted by the chip 64 and emits the white light. Thus, when an electric potential is applied to the solder or stud bumps 50, the chip 64 is energized generating the light.

In an alternate embodiment, the phosphor layer 66 can be eliminated and the lens 28, the prism 24 or other optic can be treated with a phosphor to convert the blue light to the white light. Further, any known technique for generating white LED light can be employed that is suitable for a vehicle headlight.

The various components of the light unit 38 discussed above can be made of any material suitable for the purposes discussed herein. For example, the MCB 48 can be a suitable printed circuit board having copper traces, the submount 56 can be made of AlN (aluminum nitrite) and the semiconductor chip 64 can be made of InGaN. However, it is stressed that these are by way of non-limiting examples, in that other materials may be equally applicable for the purposes described herein. The submount 56 provides larger contact areas for the solder or stud bumps 50, which decreases adverse affects of the differences in coefficients of thermal expansion between the chip 64 and the MCB 48. However, in alternate designs, the submount 56 may be eliminated if the coefficients of thermal expansion between the chip 64 and the MCB 48 can be suitably matched to maintain the desired connection over the entire range of operating temperatures.

In one embodiment, the stud bumps 60 are "scrubbed" or ultrasonically welded to electrical couple the chip 64 to traces on the submount 56. In another embodiment, the chip 64 is mounted to the submount 56 by reflowing the solder bumps 60 to contact traces on the top surface 62 of the submount 56. However, the heat required to reflow the solder bump 60 may burn or otherwise damage the phosphor layer 66. Examples of suitable solder materials that typically have a reflow temperature above the temperature that would damage the phosphor layer 66 include tin-lead (Sn-37Pb), MP 183° C., tin-copper (Sn-0.7Cu), MP 227° C., and tin-silver (Sn-3.5Ag), MP 221° C. According to the invention, the chip 64 is first mounted to the submount 56, or in an alternate embodiment directly to the MCB 48, before the phosphor layer 66 is deposited over the chip 64. Once the chip 64 is electrically coupled to the submount 56, a stencil is used to pattern the phosphor layer 66 so that it is deposited over the several chips 64. Thus, the phosphor layer 66 does not burn from the chip production heat.

In one embodiment, an underfill technique is used to help eliminate bridging of the submount 56, which results in more inherent adhesion of the submount 56 to the MCB 48. The binders and other elements of the solder paste matrix burn off after solder reflow. The metallization on the backside of the submount 56 can include 0.1-0.2 µm Ti, 0.2-0.3 µm Pt, 0.1 µm Au, 3.04.0 µm Ni or 0.1 µm Au. These metallizations do not need to match the solder paste, but the gold content of the solder paste must be such that brittle bonds do not form upon reflow. If there is too much gold in the solder paste at this time, the solder joint is made up of primarily a brittle structure, which becomes a possible failure point during vibration and/or thermal stresses. This also helps to hold the chip 64 during the injection molding process to eliminate breaking.

Further, the semiconductor chip 64 can have any shape that can be manufactured and provide the desired light pattern. Typically, semiconductor chips are formed by dicing a semiconductor die in a square pattern. Semiconductor chips being 1 mm by 1 mm square may be suitable for the LED units 38. However, in an alternate design the chip 64 can be cut from a semiconductor die in a rectangular pattern to provide an elongated chip that provides a more desirable light pattern. In one design, the chip 64 can be 1 mm by 6 mm or 1 mm by 2 mm. By providing a rectangular chip, variations in the collimation and spread of the light can be achieved that may be more desirable for a vehicle headlight. Also, a cluster of separate LED semiconductor chips of varying shapes can be provided on a common substrate to provide the desired light pattern.

In addition to the chip shape, other techniques can be used to enhance or define the beam pattern of the chip 64. Particularly, electrode path or patterns can be printed on the chip 64 to conduct the electricity to make the semiconductor operate. In one embodiment, the electrode path is printed on the chip 64 in the form of the headlight cutoff (the area of light to dark imaged on the row). Another embodiment includes printing the cutoff pattern on the phosphor layer 66.

The configuration of the unit 38 discussed above provides a chip-on-board electrical connection technology. Particularly, the solder or stud bumps 50 and 60 provide direct mounting of the submount 56 to the MCB 48 and the chip 64 to the submount 56, as shown. Further, using the chip-on-board technology provides other advantages, including a reduction of movement of the chip 64 during soldering that provides greater registration of the light to the optics, elimination of the thermal path by eliminating the heat slug heretofore employed in white LED designs, reduction of part count, and increased reliability because of the elimination of wire bonds to the chip 64.

As discussed herein, the lenses 28 need to be accurately aligned to their respective LED chip 64. According to the invention, during the injection molding process, a series of pins 68 associated with a die 70 are inserted in a registration hole 76 in the MCB 48 to provide alignment and registration.

Figure 6:
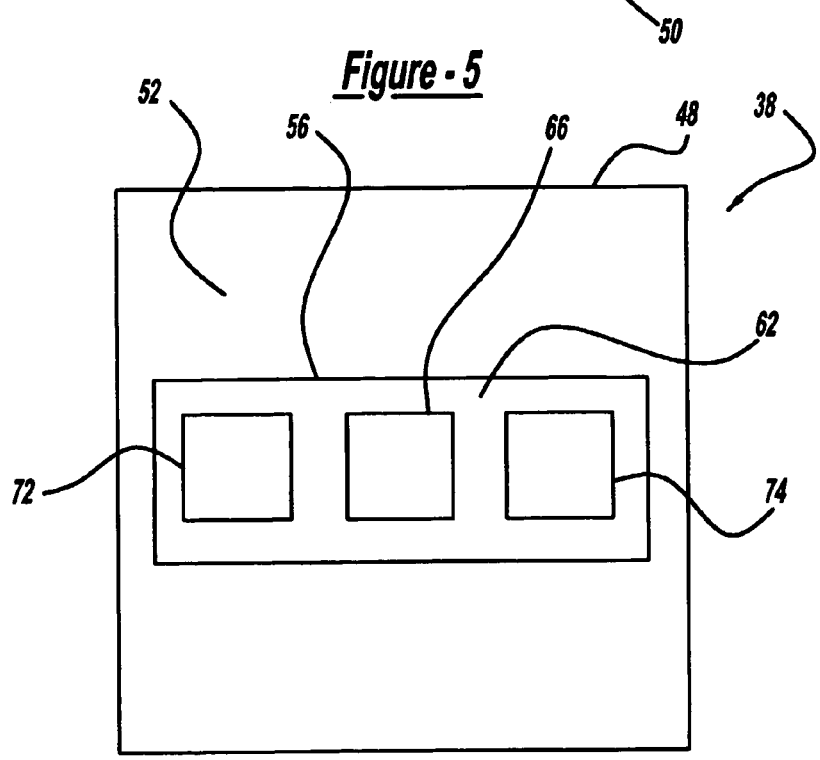
FIG. 6 is a top view of the LED unit shown in FIG. 4.

In order to get the intensity of light necessary for the headlight 12, the present invention proposes shaping the head portion 32 of the lens 28 in such a manner that some of the light is reflected back to the light unit 38 to be redirected. FIG. 6 is a top view of the light unit 38 depicting this part of the invention. In this embodiment, the chip 64 is square. The top surface 62 of the submount 56 is metallized at first and second virtual image locations 72 and 74. The metallization can be any suitable reflective material, such as aluminum or silver. Light emitted from the chip 64 is directed to the outer surface 44 of the head portion 32, and some of the light is redirected back to the locations 72 and 74 as virtual images to be reflected therefrom. Some of the light from the semiconductor chip 64 is directed out of the lens 28 into the prism 24. The light that is reflected from the virtual image locations 72 and 74 is re-reflected off of the outer surface 44 of the head portion 32 to be directed into the body portion 34, out of the lens 28 and into the prism 24. Thus, the re-reflection of the light from the virtual image locations 72 and 74 generates higher intensity beam. For those embodiments where the chip 64 is rectangular, the virtual images may be able to be eliminated.

Figure 7:
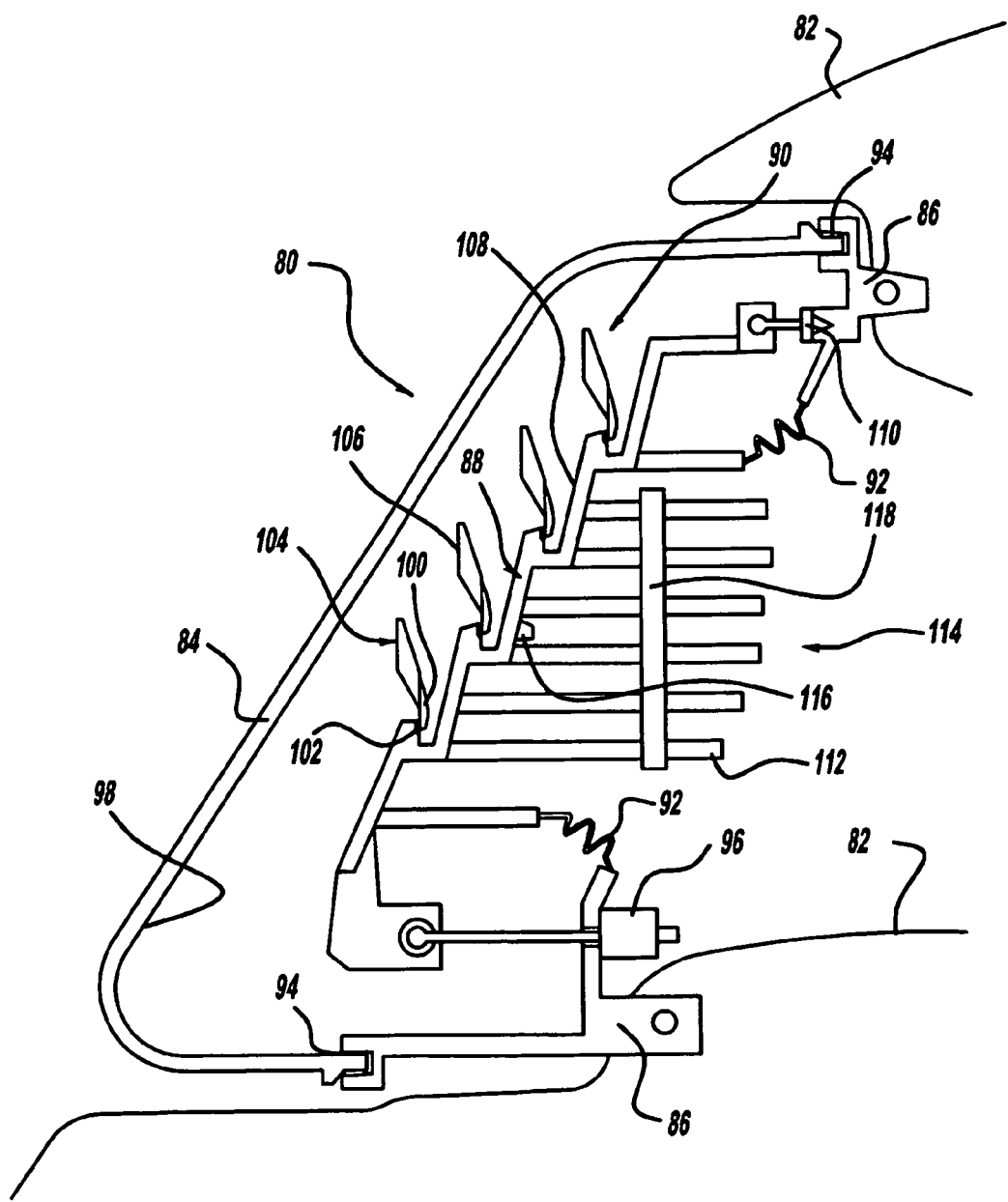
FIG. 7 is a cross-sectional view of a vehicle headlight employing a plurality of headlight units, according to another embodiment of the present invention.

FIG. 7 is a cross-sectional view of a vehicle headlight 80, according to another embodiment of the present invention, mounted to a vehicle body panel 82. The headlight 80 includes an outer lens 84 that is mounted to a lamp housing 86 by a suitable glue or sealant at a joint 94 to define a sealed lamp compartment 98. The headlight 80 further includes a carrier 88 having the shape as shown to accommodate a plurality of headlight units 90, as will be discussed in more detail below. The carrier 88 is mounted to the lamp housing 86 by an adjuster 96 and a pivot element 110. The lamp housing 86 is rigidly mounted to the vehicle body panel 82. The adjuster 96 rotates the carrier 88 in two degrees of freedom on the pivot element 110 to align the headlight units 90.

A flexible boot 92 is mounted to the lamp housing 86 and the carrier 88, as shown. The flexible boot 92 allows the carrier 88 to be rotated on the pivot element 110 while still maintaining the seal integrity of the lamp compartment 98. The flexible boot 92 can be made of any suitable material, such as rubber. The flexible boot 92 provides the ability for the headlight 80 to be directionally positioned without affecting the seal that prevents moisture from entering the lamp compartment 98.

In one embodiment, the carrier 88 is co-molded in combination with the flexible boot 92, and then the flexible boot 92 is clipped to the lamp housing 86 by some mechanical device (not shown) when it is installed. Alternately, the flexible boot 92 can be molded independent of the carrier 88 and the lamp housing 86, and clipped by a mechanical device at a later time during installation.

The carrier 88 includes a heat sink 14, such as a plurality of spaced apart fins 112. The heat sink 114 is in thermal contact with air circulating through the engine compartment so that fins 112 are cooled, and thus heat is drawn away from the headlight units 90. Alternately, the heat sink 114 can include a thermal pipe 118, a thermal cooler 116 or other suitable heat sinking device.

Each of the headlight units 90 includes a lens 100 and an LED unit 102 of the type discussed above. A plurality of the lenses 100 and associated LED units 102 are mounted to a single prism 104 in the manner discussed above, where the light from all of the units 102 is emitted from a front face 106 of the prism 104. In this embodiment, the units 90 are flipped 180° from those shown in FIG. 1. The headlight units 102 are mounted to an indented portion 108 of the carrier 88, as shown.

As is known in the art, LED units employ drive modules that provide a constant current source to the LEDs for proper operation. Alternately, the drive modules can provide a pulse width modulated signal. According to the invention, the drive module can be mounted to the headlight plate 88. In an alternate embodiment, the drive module can be integrated with the electronics of the LED or MCB to reduce weight and conserve space.

Figure 8:
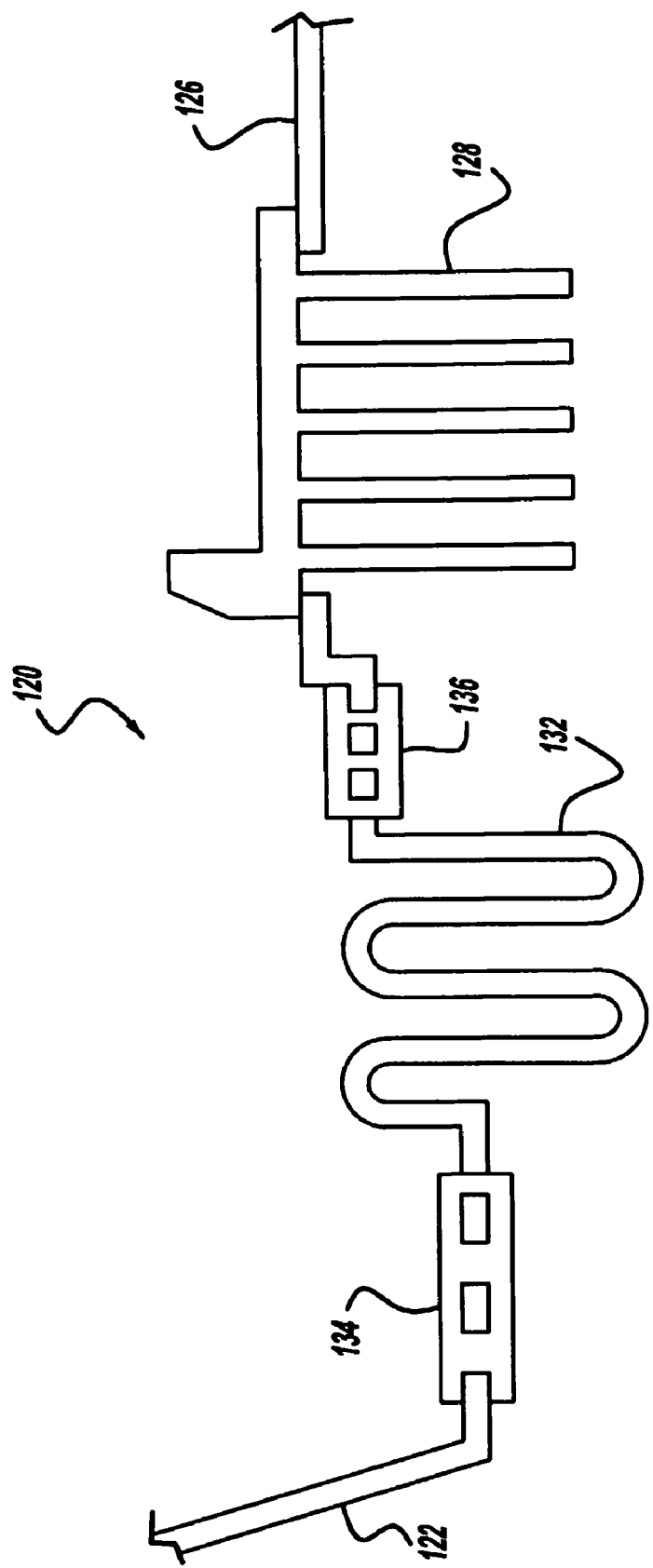
FIG. 8 is a plan view of a lamp housing being coupled to a carrier by a flexible boot, according to an embodiment of the present invention.
Figure 9:
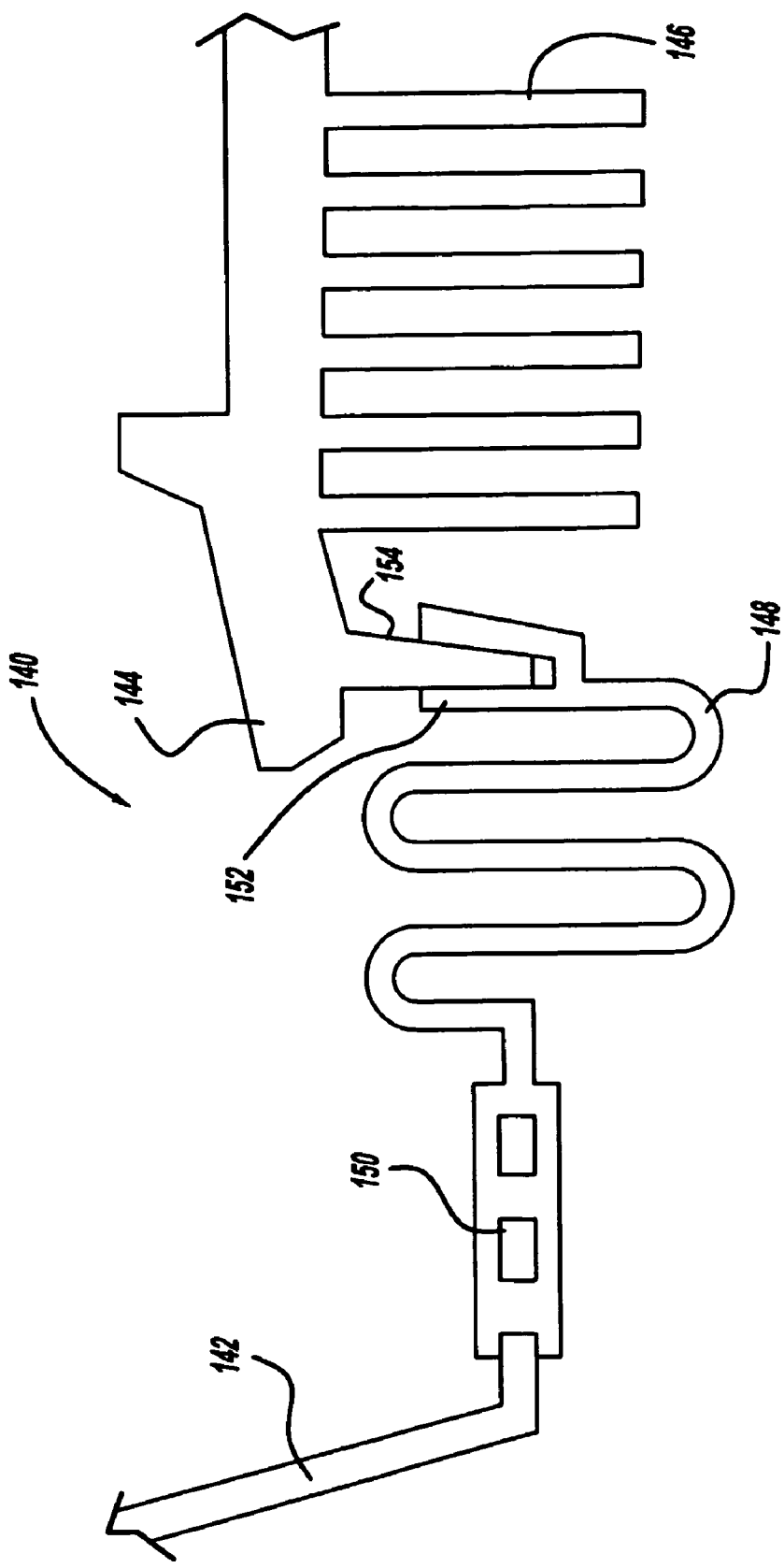
FIG. 9 is a plan view of a lamp housing being coupled to a carrier by a flexible boot, according to another embodiment of the present invention.

FIGS. 8 and 9 are plan views showing techniques for sealing a vehicle headlight to a carrier discussed generally above, according to the invention, that allow the headlight lamp to be sealed and provide a rotational two-axis degree of freedom of the lamp optics needed for headlight aiming. Particularly, FIG. 8 is a plan view of a vehicle headlight assembly 120 that includes a lamp housing 122 that may include the LED units discussed above, or any other lamp housing and associated assembly known in the art. The assembly 120 further includes a carrier 126 including heat sink fins 128 for removing heat from the headlight lamp. In one embodiment, the carrier 126 is a die cast carrier panel, and represents a suitable vehicle structure to which the lamp housing 122 is mounted. In one embodiment, the carrier 126 is a plastic panel for an aluminum carrier assembly or any other suitable carrier panel for the purposes described herein. A rubber boot or bellows 132 provides flexible coupling between the lamp housing 122 and the carrier 126. The bellows 132 includes a connecting structure 134 for connecting the bellows 132 to the lamp housing 122, and a connecting structure 136 for connecting the bellows 132 to the carrier 126.

According to the invention, the carrier 126 and the lamp housing 122 are placed in a mold, and rubber material is injected into the mold to form the bellows 132 molded to the lamp housing 122 and the carrier 126, as shown. Thus, the lamp housing 122 can be positioned in the desired directional orientation by a suitable actuation device, and heat can still be removed therefrom through the bellows 132.

FIG. 9 is a plan view of a headlight assembly 140, according to another embodiment of the present invention. The assembly 140 includes a lamp housing 142, a carrier 144 including an associated heat sink fins 146, and a rubber boot or bellows 148. In this embodiment, the lamp housing 142 is placed in the bellows mold and the bellows 148 is molded thereto at a connection area 150. Additionally, a mechanical clip 152 is placed in the mold, and is also co-molded to the bellows 148. The clip 152 is then clipped to an extended flange 154 of the carrier 144 to secure the lamp housing to the carrier 144 and the heat sink 146.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A light source comprising at least one light emitting diode (LED) assembly, said LED assembly including a base substrate, said base substrate including base solder or stud bumps, a submount substrate mounted on the base substrate, said submount substrate including submount solder or stud bumps, and an LED semiconductor chip mounted on the submount substrate and in electrical contact with the submount solder or stud bumps, said LED semiconductor chip being electrically coupled to the base substrate through electrical vias extending through the submount substrate that are in electrical contact with the base solder or stud bumps and the submount solder or stud bumps;
wherein the at least one LED assembly further includes a phosphor layer deposited over the LED semiconductor chip, said LED semiconductor chip emitting blue light and said phosphor layer converting the blue light to white light; and
wherein a light beam cutoff pattern of the LED assembly is printed into the phosphor layer.

2. A light source comprising:
at least one light emitting diode (LED) assembly, said LED assembly including a base substrate, said base substrate including base solder or stud bumps, a submount substrate mounted on the base substrate, said submount substrate including submount solder or stud bumps, and an LED semiconductor chip mounted on the submount substrate and in electrical contact with the submount solder or stud bumps, said LED semiconductor chip being electrically coupled to the base substrate through electrical vias extending through the submount substrate that are in electrical contact with the base solder or stud bumps and the submount solder or stud bumps;
a headlight housing and a carrier being pivotally mounted to the headlight housing by an adjuster and a pivot element so as to direct the headlight in two-axis of freedom; and
a flexible boot, said flexible boot being mounted to the carrier and the headlight housing so as to allow the carrier to be rotated and to maintain the seal integrity;
wherein the light source is a vehicle light source, the light source is a vehicle headlight, and the LED assembly is sealed from the environment.

3. The light source according to claim 2 wherein the flexible boot is co-molded to the headlight housing and the carrier.

4. The light source according to claim 2 wherein the flexible boot is co-molded to the headlight housing and a mechanical clip, and wherein the mechanical clip is clipped to the carrier.

5. The light source according to claim 2 wherein the flexible boot is a rubber boot.

6. A light source comprising at least one light emitting diode (LED) assembly, the LED assembly including an LED semiconductor chip and a substrate, said semiconductor chip being electrically coupled to the substrate, said LED assembly further including a molded primary optic formed over the LED assembly in contact with the substrate so that there is not an air gap between the primary optic and the LED semiconductor chip;
wherein the at least one LED assembly further includes a phosphor layer deposited over the LED semiconductor chip, said LED semiconductor chip emitting blue light and said phosphor layer converting the blue light to white light; and
wherein a light beam cutoff pattern of the LED assembly is printed into the phosphor layer.

7. A light source comprising:
at least one light emitting diode (LED) assembly, the LED assembly including an LED semiconductor chip and a substrate, said semiconductor chip being electrically coupled to the substrate, said LED assembly further including a molded primary optic formed over the LED assembly in contact with the substrate so that there is not an air gap between the primary optic and the LED semiconductor chip;
a carrier, said substrate being mounted to the carrier;

a headlight housing, said carrier being pivotally mounted to the headlight housing by an adjuster and a pivot element so as to direct the headlight in two-axis of freedom; and a flexible boot, said flexible boot being mounted to the carrier and the headlight housing so as to allow the carrier to be rotated and to maintain the seal integrity;

wherein the light source is a vehicle headlight and the LED assembly is sealed from the environment.

8. The light source according to claim 7 wherein the flexible boot is co-molded to the headlight housing and the carrier.

9. The light source according to claim 7 wherein the flexible boot is co-molded to the headlight housing and a mechanical clip, and wherein the mechanical clip is clipped to the carrier.

10. The light source according to claim 7 wherein the flexible boot is a rubber boot.

11. A vehicle headlight comprising at least one headlight unit, said at least one headlight unit including an optical structure, said at least one headlight unit further including a plurality of spaced apart primary optic lenses optically coupled to a front face of the optical structure, said at least one headlight unit further including a plurality of light emitting diode (LED) assemblies, where a single LED assembly is provided for each lens, wherein each LED assembly emits a beam of light that is focused and directed by the elongated lens and is collected and directed by the optical structure to be emitted from the front face of the optical structure as a single beam of light, wherein each LED assembly in the plurality of LED assemblies provides a portion of the intensity of the entire light pattern;

wherein each LED assembly includes an LED semiconductor chip that emits blue light and a phosphor layer that converts the blue light to white light; and wherein a light beam cutoff pattern of the LED assembly is printed into the phosphor layer.

12. A vehicle headlight comprising:

at least one headlight unit, said at least one headlight unit including an optical structure, said at least one headlight unit further including a plurality of spaced apart primary optic lenses optically coupled to a front face of the optical structure, said at least one headlight unit further including a plurality of light emitting diode (LED) assemblies, where a single LED assembly is provided for each lens, wherein each LED assembly emits a beam of light that is focused and directed by the elongated lens and is collected and directed by the optical structure to be emitted from the front face of the optical structure as a single beam of light, wherein each LED assembly in the plurality of LED assemblies provides a portion of the intensity of the entire light pattern;

a common carrier, the plurality of LED assemblies being mounted to said carrier;

a headlight housing, said carrier being pivotally mounted to the headlight housing by an adjuster and a pivot element to direct the headlight in two degrees of freedom; and a flexible boot, said flexible boot being mounted to the carrier and the headlight housing so as to allow the carrier to be rotated and maintain a headlight seal integrity.

13. The headlight according to claim 12 wherein the flexible boot is co-molded to the headlight housing and the carrier.

14. The headlight according to claim 12 wherein the flexible boot is co-molded to the headlight housing and a mechanical clip, and wherein the mechanical clip is clipped to the carrier.

15. The headlight according to claim 12 wherein the flexible boot is a rubber boot.

16. A vehicle headlight comprising:

at least one headlight unit, said at least one headlight unit including a plurality of light emitting diode (LED) assemblies, where a single LED assembly is provided for each lens, said LED assembly including a base substrate, said base substrate including base solder or stud bumps, a submount substrate mounted on the base substrate, said submount substrate including submount solder or stud bumps, and an LED semiconductor chip mounted on the submount substrate and in electrical contact with the submount solder or stud bumps, said LED semiconductor chip being electrically coupled to the base substrate through electrical vias extending through the submount substrate that are in electrical contact with the substrate solder or stud bumps and the submount solder or stud bumps, wherein each LED assembly emits light that is focused and directed to be emitted as a single beam of light;

a common carrier, the plurality of LED assemblies being mounted to said carrier;

a headlight housing, said carrier being pivotally mounted to the headlight housing by an adjuster and a pivot element to direct the headlight in two degrees of freedom; and a flexible boot, said flexible boot being mounted to the carrier and the headlight housing so as to allow the carrier to be rotated and maintain a headlight seal integrity.

17. The headlight according to claim 16 wherein the flexible boot is co-molded to the headlight housing and the carrier.

18. The headlight according to claim 16 wherein the flexible boot is co-molded to the headlight housing and a mechanical clip, and the mechanical clip is clipped to the carrier.

19. The headlight according to claim 16 wherein the flexible boot is a rubber boot.

* * * * *